United States Patent [19]
Satoh et al.

[11] Patent Number: 5,445,897
[45] Date of Patent: Aug. 29, 1995

[54] EPITAXIAL WAFER AND PROCESS FOR PRODUCING THE SAME

[75] Inventors: Tadashige Satoh; Hisanori Fujita, both of Ushiku, Japan

[73] Assignees: Mitsubishi Kasei Polytec Company; Mitsubishi Kasei Corporation, both of Tokyo, Japan

[21] Appl. No.: 69,672

[22] Filed: Jun. 1, 1993

Related U.S. Application Data

[63] Continuation-in-part of Ser. No. 616,266, Nov. 20, 1990, abandoned.

[30] Foreign Application Priority Data

Nov. 22, 1989 [JP] Japan .................. 1-303677

[51] Int. Cl.$^6$ .................. H01L 21/20; H01L 33/00
[52] U.S. Cl. .................. 428/688; 148/33.4; 428/699; 428/700; 428/704
[58] Field of Search .............. 148/DIG. 65, DIG. 72, 148/33.4; 428/212, 216, 699, 700, 704, 688

[56] References Cited

U.S. PATENT DOCUMENTS

| | | | |
|---|---|---|---|
| 4,007,074 | 2/1977 | Ogirima et al. .................. | 437/969 |
| 4,088,515 | 5/1978 | Blakeslee et al. .................. | 437/128 |
| 4,252,576 | 2/1981 | Hasegawa et al. .................. | 437/127 |
| 4,865,655 | 9/1989 | Fujita et al. .................. | 148/33.4 |
| 5,057,442 | 10/1991 | Habuka .................. | 437/127 |

*Primary Examiner*—Nasser Ahmad
*Attorney, Agent, or Firm*—Armstrong, Westerman, Hattori, McLeland & Naughton

[57] ABSTRACT

In order to grow a $GaAs_{1-x}P_x$ fixed-composition layer of excellent quality, which has a predetermined composition x, over a GaAs or GaP single crystal substrate, a varied-composition layer is formed between the substrate and the fixed-composition layer. The varied-composition layer comprises at least two varied-composition layer portions and at least one fixed-composition layer portion with a predetermined thickness that is formed between the varied-composition layer portions, whereby dislocations caused by lattice mismatch with the GaP substrate are settled in the varied-composition layer portions and recovered in the fixed-composition layer portion between the varied-composition layer portions, thereby minimizing the dislocations, and thus making it possible to obtain a $GaAs_{1-x}P_x$ layer of excellent crystal quality, which has a predetermined composition x.

1 Claim, 8 Drawing Sheets

LEGEND

1 : GaAs OR GaP SINGLE CRYSTAL SUBSTRATE
2 : VARIED-COMPOSITION LAYER
2a : VARIED-COMPOSITION LAYER
2b : FIXED-COMPOSITION LAYER
2c : VARIED-COMPOSITION LAYER
2d : FIXED-COMPOSITION LAYER
2e : VARIED-COMPOSITION LAYER
3 : $GaAs_{1-x}P_x$ FIXED-COMPOSITION LAYER

LEGEND

1 : GaAs OR GaP SINGLE CRYSTAL SUBSTRATE
2 : VARIED-COMPOSITION LAYER
2a : VARIED-COMPOSITION LAYER
2b : FIXED-COMPOSITION LAYER
2c : VARIED-COMPOSITION LAYER
2d : FIXED-COMPOSITION LAYER
2e : VARIED-COMPOSITION LAYER
3 : $GaAs_{1-x}P_x$ FIXED-COMPOSITION LAYER

EPITAXIAL WAFER AND PROCESS FOR PRODUCING THE SAME

This application is a continuation-in-part of application Ser. No. 07/616,266, filed Nov. 20, 1990 now abandoned.

BACKGROUND OF THE INVENTION

The present invention relates to an epitaxial wafer comprising a $GaAs_{1-x}P_x$ single crystal layer that is grown on a GaAs or GaP single crystal substrate, wherein a $GaAs_{1-x}P_x$ layer in which x is gradually varied from 0 before being fixed is grown between the single crystal substrate and the $GaAs_{1-x}P_x$ layer. The present invention also relates to a process for producing the described epitaxial wafer.

A wafer comprising a $GaAs_{1-x}P_x$ single crystal film that is epitaxially grown on a GaP single crystal substrate is widely used as a material for light-emitting diodes after having Zn diffused thereinto to form a pn junction. In general, nitrogen (N) is doped into the $GaAs_{1-x}P_x$ layer to induce an isoelectronic trap, thereby increasing the luminous efficiency. The wavelength of light emitted from a light-emitting diode is determined by the composition x: $x=0.9$ is employed to emit yellow light, $x=0.75$ for orange light, and $x=0.65$ for red light.

If the quality of $GaAs_{1-x}P_x$ crystal is inadequate, a non-luminescent center is induced in the resulting light-emitting diode. Therefore, $GaAs_{1-x}P_x$ crystal must have excellent quality in order to provide a high-luminance light-emitting diode. For example, if a fixed-composition layer 11 that has a fixed composition, i.e., $x=0.75$, is epitaxially grown directly on a GaP substrate 12, as shown in FIG. 8, the lattice mismatch cannot completely be relieved due to the lattice constant difference, so that misfit dislocations are extended into the fixed-composition layer 11 from the interface 13, resulting in the crystal quality of the layer 11 being deteriorated considerably. In order to avoid this problem, it is a conventional practice to form a varied-composition layer 22, in which the composition x is gradually varied, between a GaP substrate 23 and a fixed-composition layer 21, as shown in FIG. 9, thereby relieving the lattice mismatch between the GaP substrate 23 and the fixed-composition layer 21. Thus, misfit dislocations at the interface 25 between the GaP substrate 23 and the epitaxial layer 22 can be prevented from extending into the $GaAs_{1-x}P_x$ fixed-composition layer 21, so that excellent crystal quality can be obtained.

In the conventional structure that is shown in FIG. 9, the rate of change in the composition of the varied-composition layer 22 is, in general, 0.02 or less per $\mu m$ in the direction of growth. It is known that a rapid change in the composition not only deteriorates the crystal quality of the fixed-composition layer 21 that is formed subsequently to the varied-composition layer 22, but also causes surface crystal defects, for example, hillocks, on the surface of the fixed-composition layer 21.

Even if the fixed-composition layer 21 is formed through the varied-composition layer 22, lattice mismatch is still present between the fixed-composition layer 21 and the GaP substrate 23, and it is therefore impossible to completely relieve the lattice mismatch by the varied-composition layer 22. The crystal quality of the fixed-composition layer 21 greatly depends on the method of producing the varied-composition layer 22, resulting in large variations in the luminance (light output) of a light-emitting diode produced by employing the resulting epitaxial wafer. More specifically, if the rate of change in the composition of the varied-composition layer 22 is reduced, the thickness of the varied-composition layer 22 unavoidably increases, which results in an increase in the material cost. In addition, it is impossible to improve the crystal quality of the fixed-composition layer 21 simply by reducing the rate of change in the composition of the varied-composition layer 22.

SUMMARY OF THE INVENTION

In view of the above-described problems of the prior art, it is an object of the present invention to provide a $GaAs_{1-x}P_x$ epitaxial wafer which enables a high-luminance light-emitting diode to be obtained, the epitaxial wafer having a varied-composition layer that is formed between a single crystal substrate and a $GaAs_{1-x}P_x$ fixed-composition layer, the varied-composition layer comprising at least one fixed-composition layer and at least two varied-composition layers.

It is another object of the present invention to provide a process for producing the above-described epitaxial wafer.

According to the present invention, in order to grow a $GaAs_{1-x}P_x$ fixed-composition layer 3 of excellent quality, which has a predetermined composition x, over a GaAs or GaP single crystal substrate 1, a varied-composition region 2 is formed between the substrate 1 and the fixed-composition layer 3, as shown in FIG. 1. The varied-composition region 2 comprises at least two varied-composition layer portions, e.g., varied-composition layer portions 2a, 2c and 2e, and at least one fixed-composition layer portion with a thickness of 1 $\mu m$ or more, e.g., fixed-composition layer portions 2b and 2d, at least one of the varied-composition layer portions being formed such that the rate of change in the composition $\Delta x$ per $\mu m$ satisfies the following condition:

about $0.02 \leq \Delta x \leq$ about $0.08$ thereby stepwise varying the composition.

DETAILED DESCRIPTION OF THE PREFERRED EMBODIMENTS

Figure 1:
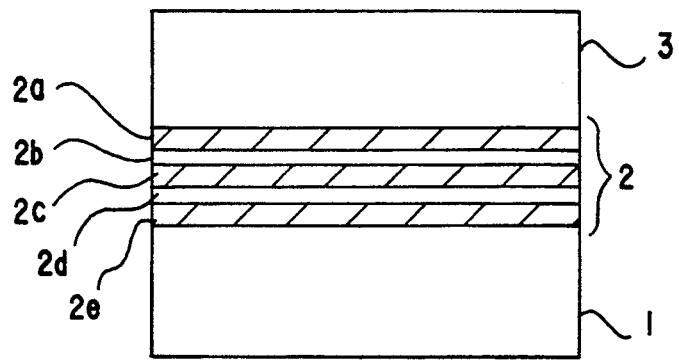
FIG. 1 shows a sectional structure of the light-emitting diode according to the present invention.

Examples of the present invention will be described below.

[EXAMPLE 1]

According to the present invention, a $GaAs_{1-x}P_x$ ($x \approx 0.75$) epitaxial film for an orange light-emitting diode (peak emission wavelength: about 610 nm $\pm$ 2 nm)

was formed on a GaP single crystal substrate in the manner described below.

First, a GaP single crystal substrate which had sulfur (S) added thereto as an n-type impurity at $5 \times 10^{17}$ atoms/cm$^3$ and which had a plane crystallographically oriented by about 6° toward <110> direction from (100) plane was prepared. The GaP single crystal substrate, which first had a thickness of about 370 μm, was reduced to a thickness of 300 μm by mechanical-chemical polishing subsequent to degreasing with an organic solvent.

Next, the polished GaP single crystal substrate and a quartz boat containing high-purity Ga were set at predetermined positions, respectively, in a horizontal quartz epitaxial reactor having an inner diameter of 70 mm and a length of 100 cm.

Nitrogen (N$_2$) was introduced into the epitaxial reactor to replace and remove air sufficiently. Next, hydrogen gas (H$_2$) was introduced as a carrier gas at 3000 ml/min, and the supply of N$_2$ was cut off to enter into a heat-up process.

After it was confirmed that the temperature in the Ga-containing quartz boat setting region and the temperature in the GaP single crystal substrate setting region were maintained at 830° C. and 930° C., respectively, vapor phase epitaxial growth of an epitaxial GaAs$_{1-x}$P$_x$ film for an orange light-emitting diode was started.

From the start of the vapor phase epitaxial growth, hydrogen sulfide (H$_2$S) diluted to a concentration of 10 ppm with hydrogen gas was introduced as an n-type impurity at 6.3 ml/min, while high-purity hydrogen chloride gas (HCl) was introduced at 63 ml/min to react with Ga (a Group (III) element) to form approximately 100% GaCl. In the meantime, PH$_3$ diluted to a concentration of 10% with H$_2$ was introduced at 291 ml/min, and with the growth temperature (equivalent to the substrate temperature) being maintained at 930° C. for the first 10 minutes, a first GaP epitaxial layer was formed on the GaP single crystal substrate.

A second varied-composition layer was formed as follows.

For the next 5 minutes, the growth temperature was gradually lowered from 930° C. to 918° C. and, at the same time, the flow rate of AsH$_3$ was changed from 0 ml/min to 24.3 ml/min. The layer formed at this time is defined as a 2nd-1st layer.

For the next 20 minutes, the growth temperature was fixed at 918° C. and the flow rate of AsH$_3$ was fixed at 24.3 ml/min. The layer formed at this time is defined as a 2nd-2nd layer.

For the next 5 minutes, the growth temperature was gradually lowered from 918° C. to 905° C. and, at the same time, the flow rate of AsH$_3$ was changed from 24.3 ml/min to 48.5 ml/min. The layer formed at this time is defined as a 2nd-3rd layer.

For the next 20 minutes, the growth temperature was fixed at 905° C. and the flow rate of AsH$_3$ was fixed at 48.5 ml/min. The layer formed at this time is defined as a 2nd-4th layer.

For the next 5 minutes, the growth temperature was gradually lowered from 905° C. to 893° C. and, at the same time, the flow rate of AsH$_3$ was changed from 48.5 ml/min to 72.8 ml/min. The layer formed at this time is defined as a 2nd-5th layer.

For the next 20 minutes, the growth temperature was fixed at 893° C. and the flow rate of AsH$_3$ was fixed at 72.8 ml/min. The layer formed at this time is defined as 2nd-6th layer.

For the next 5 minutes, the growth temperature was lowered from 893° C. to 880° C. and, at the same time, the flow rate of AsH$_3$ was changed from 72.8 ml/min to 97 ml/min. The layer formed at this time is defined as a 2nd-7th layer.

In this way, the second layer comprising the 2nd-1st layer, 2nd-2nd layer, 2nd-3rd layer, 2nd-4th layer, 2nd-5th layer, 2nd-6th layer and 2nd-7th layer was formed.

For the next 30 minutes, a third GaAs$_{1-x}$P$_x$ epitaxial layer was grown without changing the flow rate of each gas, that is, by introducing H$_2$, H$_2$S, HCl, PH$_3$ and AsH$_3$ at 3000 ml/min, 6.3 ml/min, 63 ml/min, 291 ml/min and 97 ml/min, respectively, For the next, or final, 60 minutes, under the conditions for forming the third epitaxial layer, high-purity NH$_3$ gas was additionally introduced at 305 ml/min to form a fourth GaAs$_{1-x}$P$_x$ epitaxial layer having nitrogen (N) doped thereinto as an impurity to induce an isoelectronic trap, thereby completing the whole process for forming an epitaxial multilayer film.

The surface condition of the epitaxial wafer taken out of the reactor was excellent and free from hillocks or other surface defects.

Various physical properties of the obtained epitaxial multilayer film were measured and analyzed. The results are shown in Table 1 below.

TABLE 1

| | (data concerning Example 1) | | | |
|---|---|---|---|---|
| Epitaxial layers | Carrier density cm$^{-3}$ | Layer thickness μm | Composition x | Rate of change in composition μm$^{-1}$ |
| 1st layer | about $5 \times 10^{17}$ | 2.8 | 1 | 0 |
| 2nd layer | about 3 to $5 \times 10^{17}$ | 23.2 | | |
| 2nd-1st | | 1.2 | — | 0.054 |
| 2nd-2nd | | 5.2 | 0.935 | 0 |
| 2nd-3rd | | 1.4 | — | 0.047 |
| 2nd-4th | | 5.8 | 0.869 | 0 |
| 2nd-5th | | 1.6 | — | 0.038 |
| 2nd-6th | | 6.3 | 0.809 | 0 |
| 2nd-7th | | 1.7 | — | 0.032 |
| 3rd layer | about $3 \times 10^{17}$ | 12.2 | 0.75 | 0 |
| 4th layer | $7.5 \times 10^{15}$ | 23.0 | 0.75 | 0 |

Figure 2:
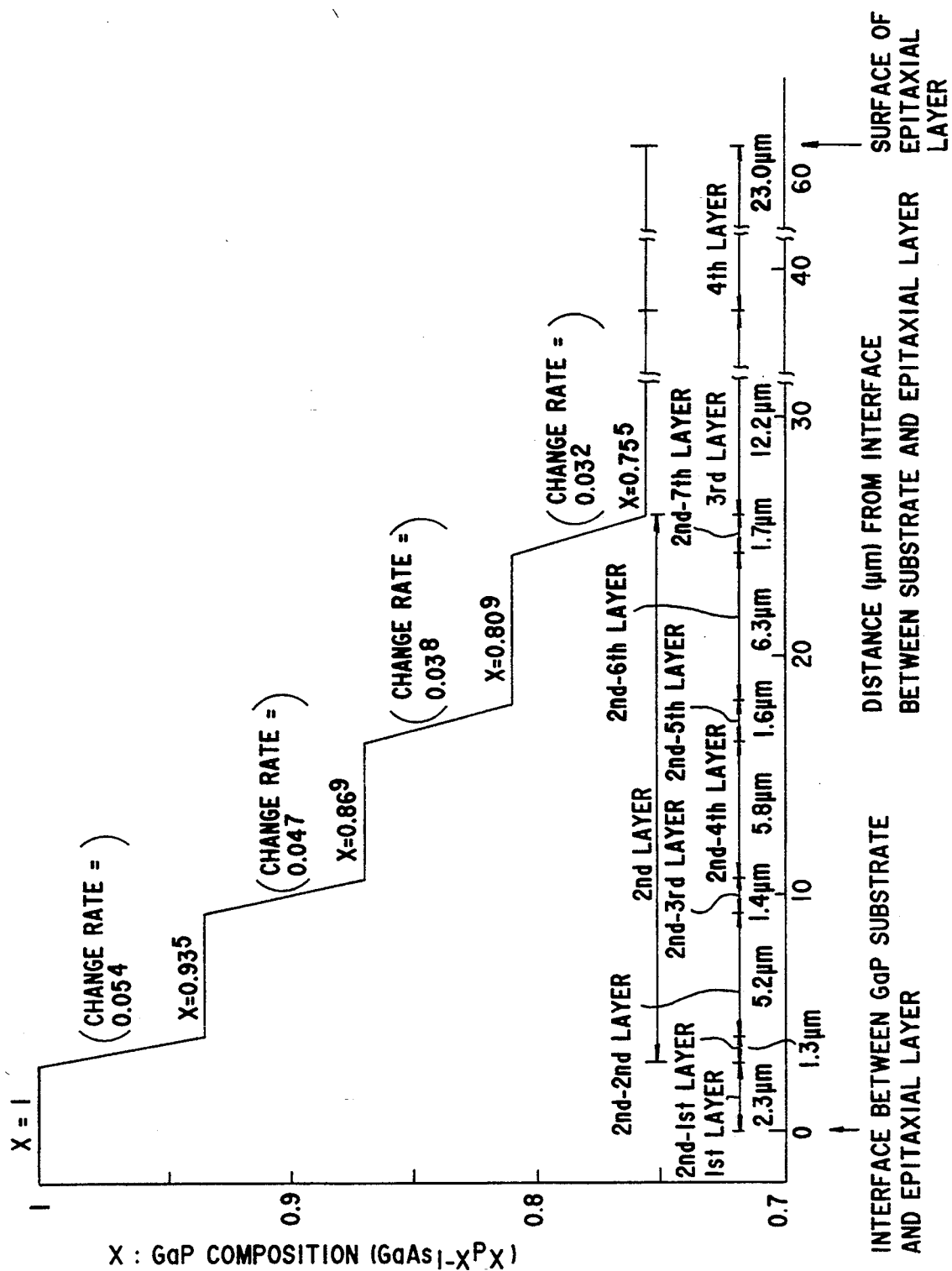
FIGS. 2 and 3 show sectional structures of examples of a light-emitting diode according to the present invention which employs a GaP single crystal substrate.

In Table 1, the rates of change in the composition for the 2nd-1st layer, 2nd-3rd layer, 2nd-5th layer and 2nd-7th layer in the 2nd layer were 0.054, 0.047, 0.038 and 0.032 (composition per μm), respectively, and the thicknesses of the 2nd-2nd layer, 2nd-4th layer and 2nd-6th layer were 5.2 μm, 5.8 μm and 6.3 μm, respectively. FIG. 2 shows the sectional structure of the composition of this Example. In the figure, the axis of abscissas represents the distance from the interface between the substrate and the epitaxial layer, and the axis of ordinates represents the composition x. It should be noted that the composition x was obtained by measuring the characteristic X-ray pattern with an X-ray microanalyzer and correcting it by ZAF correction method.

Next, an orange light-emitting diode was prepared by employing the epitaxial wafer having the epitaxial film obtained by this Example, and the luminance (light output) of the diode was measured.

More specifically, the epitaxial wafer was vacuum-sealed in a high-purity quartz ampul, together with 25 mg of ZnAs$_2$ as a p-type impurity, to carry out thermal diffusion of impurities at a temperature of 720° C. The depth of the resulting pn junction was 4.4 μm from the surface.

The epitaxial wafer obtained as described above was subjected to a series of processes, i.e., a back side (substrate) polishing process, an electrode forming process, a wire bonding process, etc., on a device manufacturing line to prepare an orange light-emitting diode chip.

Next, the light-emitting diode chip (both the chip size and the pn junction size were 500 μm by 500 μm square) was supplied with a direct current of 20 A/cm$^2$ in current density to measure the luminance (light output) under the condition that the chip had no epoxy resin coating. As a result, the peak wavelength was 610 nm±2 nm, and the luminance was from 4140 to 4320 Ft.L, on the average 4260 Ft.L.

[EXAMPLE 2]

An epitaxial wafer was prepared in the same way as in Example 1 except that the growth time for the 2nd-5th layer and the 2nd-7th layer was 15 minutes, and the physical properties were measured and analyzed by the same method as in Example 1. The results are shown in Table 2 below.

TABLE 2

| | (data concerning Example 2) | | | |
|---|---|---|---|---|
| Epitaxial layers | Carrier density cm$^{-3}$ | Layer thickness μm | Composition x | Rate of change in composition μm$^{-1}$ |
| 1st layer | about 5 × 10$^{17}$ | 2.9 | 1 | 0 |
| 2nd layer | about 3 to 5 × 10$^{17}$ | 30.4 | | |
| 2nd-1st | | 1.8 | — | 0.049 |
| 2nd-2nd | | 5.1 | 0.936 | 0 |
| 2nd-3rd | | 1.4 | — | 0.049 |
| 2nd-4th | | 5.9 | 0.868 | 0 |
| 2nd-5th | | 4.8 | — | 0.013 |
| 2nd-6th | | 6.4 | 0.808 | 0 |
| 2nd-7th | | 5.0 | — | 0.010 |
| 3rd layer | about 3 × 10$^{17}$ | 12.8 | 0.75 | 0 |
| 4th layer | 7.8 × 10$^{15}$ | 23.8 | 0.75 | 0 |

Figure 3:
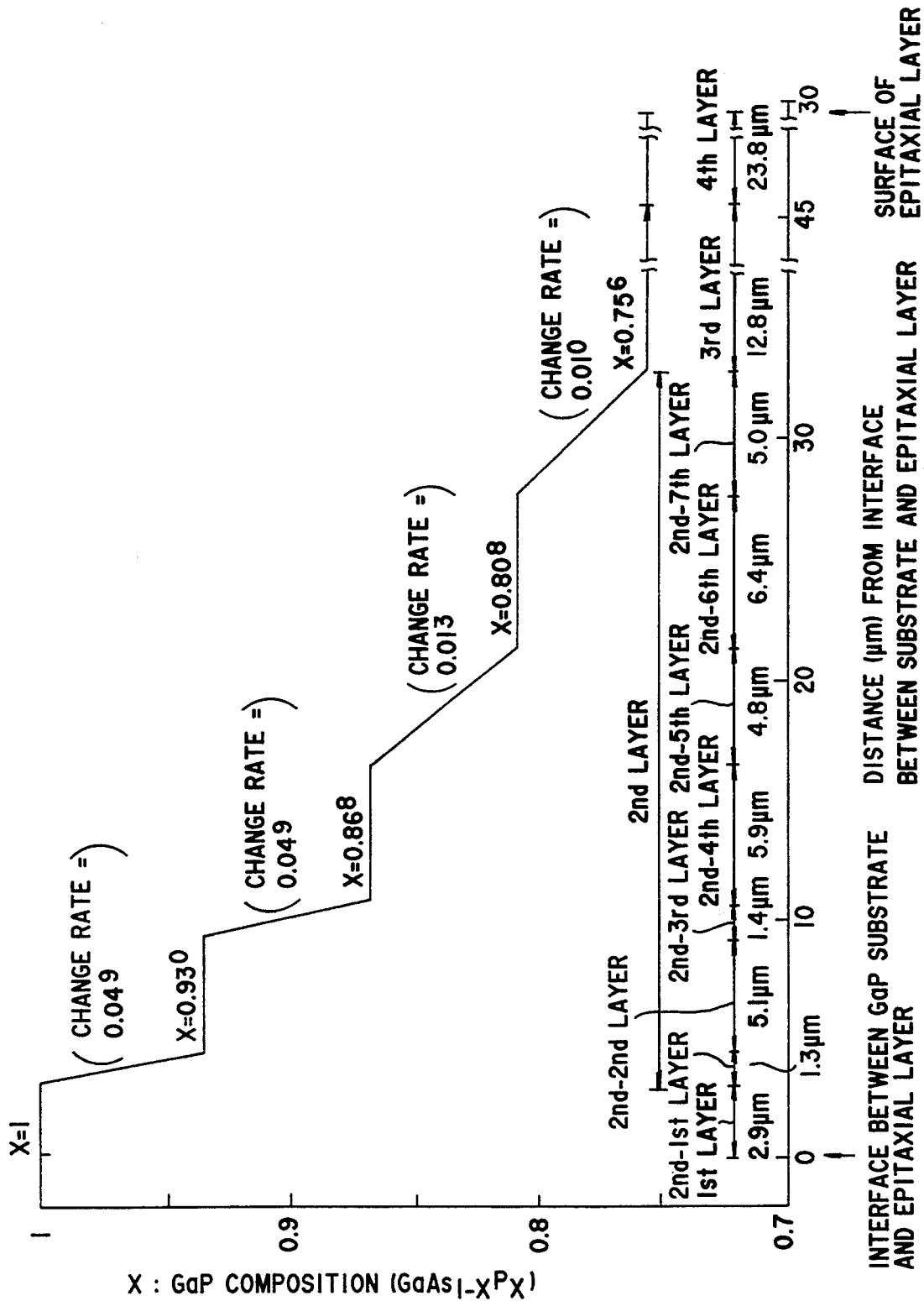

FIG. 3 shows the sectional structure of the composition of this Example.

Next, a diode chip was prepared in the same way as in Example 1, and the luminance of the chip was measured under the same conditions as in Example 1. As a result, the peak wavelength was 610 nm±2 nm, and the luminance was from 3940 to 4420 Ft.L, on the average 4190 Ft.L.

[Comparative Example 1]

According to the present invention, a GaAs$_{1-x}$P$_x$ ($x \approx 0.75$) epitaxial film for an orange light-emitting diode (peak emission wavelength: about 610 nm±2 nm) was formed on a GaP single crystal substrate in the manner described below.

First, a GaP single crystal substrate which had sulfur (S) added thereto as an n-type impurity at 5×10$^{17}$ atoms/cm$^3$ and which had a plane crystallographically oriented by about 6° toward <110> direction from (100) plane was prepared. The GaP single crystal substrate, which first had a thickness of about 370 μm, was reduced to a thickness of 300 μm by mechanical-chemical polishing subsequent to degreasing with an organic solvent.

Next, the polished GaP single crystal substrate and a quartz boat containing high-purity Ga were set at predetermined positions, respectively, in a horizontal quartz epitaxial reactor having an inner diameter of 70 mm and a length of 100 cm.

Nitrogen (N$_2$) was introduced into the epitaxial reactor to replace and remove air sufficiently. Next, hydrogen gas (H$_2$) was introduced as a carrier gas at 3000 ml/min, and the supply of N$_2$ was cut off to enter into a heat-up process.

After it was confirmed that the temperature in the Ga-containing quartz boat setting region and the temperature in the GaP single crystal substrate setting region were maintained at 830° C. and 930° C., respectively, vapor phase epitaxial growth of an epitaxial GaAs$_{1-x}$P$_x$ film for an orange light-emitting diode was started.

From the start of the vapor phase epitaxial growth, hydrogen sulfide (H$_2$S) diluted to a concentration of 10 ppm with hydrogen gas was introduced as an n-type impurity at 6.3 ml/min, while high-purity hydrogen chloride gas (HCl) was introduced at 63 ml/min to react with Ga (a Group (III) element) to form approximately 100% GaCl. In the meantime, PH$_3$ diluted to a concentration of 10% with H$_2$ was introduced at 291 ml/min, and with the growth temperature (equivalent to the substrate temperature) being maintained at 930° C. for the first 10 minutes, a first GaP epitaxial layer was formed on the GaP single crystal substrate.

For the next 100 minutes, the growth temperature was gradually lowered to 880° and, at the same time, the flow rate of AsH$_3$ was gradually changed from 0 ml/min to 97 ml/min, thereby forming a second epitaxial layer.

For the next 30 minutes, a third GaAs$_{1-x}$P$_x$ epitaxial layer was grown without changing the flow rate of each gas, that is, by introducing H$_2$, H$_2$S, HCl, PH$_3$ and AsH$_3$ at 3000 ml/min, 6.3 ml/min, 63 ml/min, 291 ml/min and 97 ml/min, respectively, For the next, or final, 60 minutes, under the conditions for forming the third epitaxial layer, high-purity NH$_3$ gas was additionally introduced at 305 ml/min to form a fourth GaAs$_{1-x}$P$_x$ epitaxial layer having nitrogen (N) doped thereinto as an impurity to induce an isoelectronic trap, thereby completing the whole process for forming an epitaxial multilayer film.

The surface condition of the epitaxial wafer taken out of the reactor was excellent and free from hillocks or other surface defects.

Various physical properties of the obtained epitaxial multilayer film were measured and analyzed. The results are shown in Table 3 below.

TABLE 3

| | (data concerning Comparative Example 1) | | | |
|---|---|---|---|---|
| Epitaxial layers | Carrier density cm$^{-3}$ | Layer thickness μm | Composition x | Rate of change in composition μm$^{-1}$ |
| 1st layer | about 5 × 10$^{17}$ | 3.0 | 1 | 0 |
| 2nd layer | about 3 to 5 × 10$^{17}$ | 22.4 | *① 0.923 *② 0.860 *③ 0.811 | <0.02 |
| 3rd layer | about 3 × 10$^{17}$ | 12.4 | 0.754 | 0 |
| 4th layer | 7.5 × 10$^{15}$ | 23.4 | 0.754 | 0 |

Figure 4:
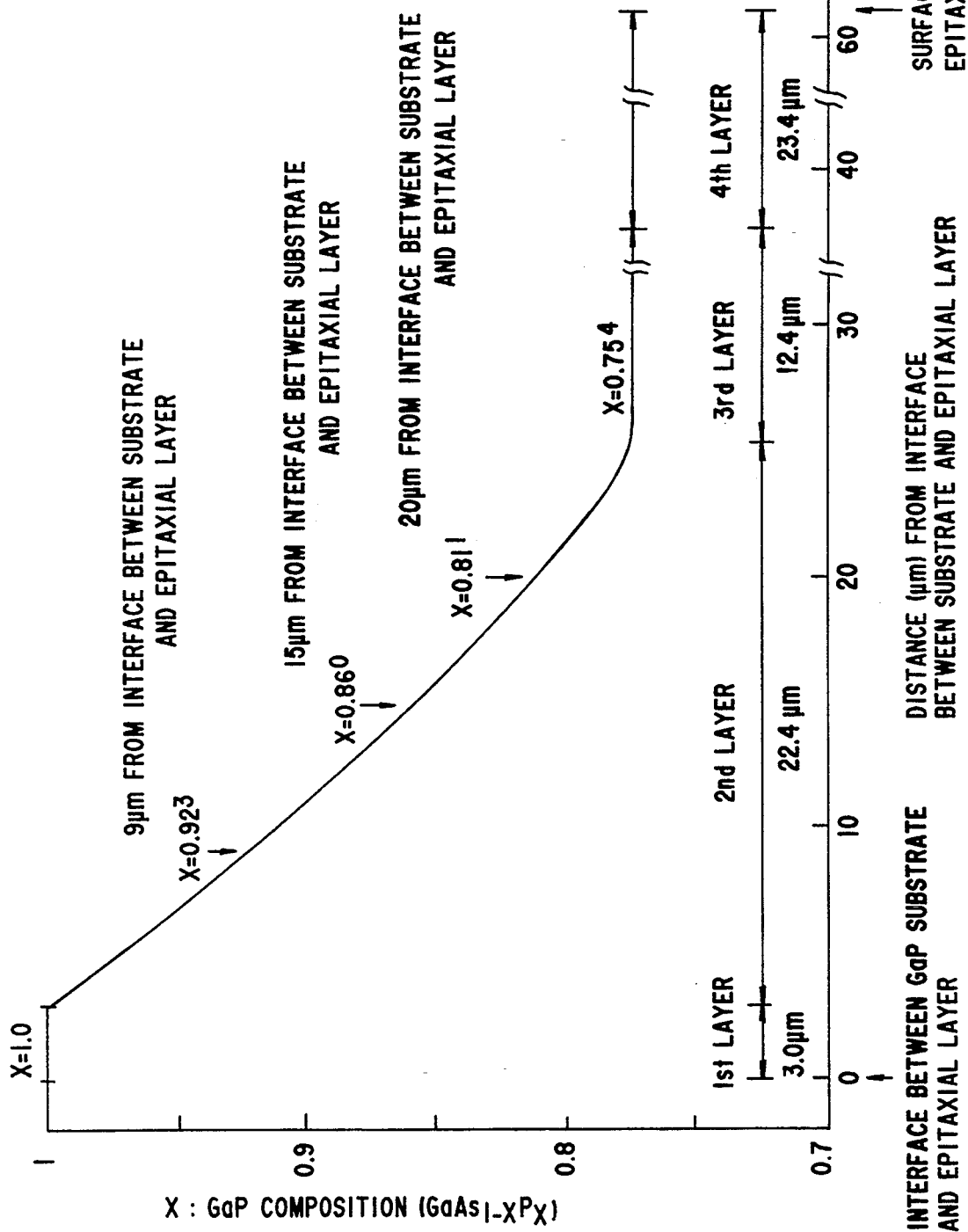
FIG. 4 shows a sectional structure of a comparative example.

In Table 3, the compositions *①, *② and *③ of the second layer were measured at respective three points which are 9 μm, 15 μm and 20 μm from the interface between the GaP substrate and the epitaxial layer. As will be clear from Table 3, the rate of change in the composition of the second layer was less than 0.02, and the thickness of the second layer was 22.4 μm. FIG. 4 shows the sectional structure of the composition of this Comparative Example.

Next, an orange light-emitting diode was prepared by employing the epitaxial wafer having the epitaxial film obtained by Comparative Example 1, and the luminance (light output) of the diode was measured.

More specifically, the epitaxial wafer was vacuum-sealed in a high-purity quartz ampul, together with 25 mg of $ZnAs_2$ as a p-type impurity, to carry out thermal diffusion of impurities at a temperature of 720° C. The depth of the resulting pn junction was 4.5 $\mu$m from the surface.

The epitaxial wafer obtained as described above was subjected to a series of processes, i.e., a back side (substrate) polishing process, an electrode forming process, a wire bonding process, etc., on a device manufacturing line to prepare an orange light-emitting diode chip. Next, the light-emitting diode chip (both the chip size and the pn junction size were 500 $\mu$m by 500 $\mu$m square) was supplied with a direct current of 20 A/cm$^2$ in current density to measure the luminance (light output) under the condition that the chip had no epoxy resin coating. As a result, the peak wavelength was 610 nm±2 nm, and the luminance was from 3330 to 3520 Ft.L, on the average 3410 Ft.L.

[EXAMPLE 3]

A GaAs single crystal substrate which was in the form of a disk having a diameter of 50 mm and a thickness of 350 $\mu$m was employed as a single crystal substrate. The surface of the substrate, which had been mirror-polished, was 2.0° inclined toward $<\overline{1}10>$ direction from $<00\overline{0}>$ plane. The GaAs single crystal substrate had silicon doped thereinto. The n-type carrier density in the substrate was $7.0 \times 10^{17}$ cm$^{-3}$.

The single crystal substrate was set in a horizontal quartz epitaxial reactor having an inner diameter of 70 mm and a length of 1000 mm. Subsequently, a quartz boat containing metal gallium was set in the reactor.

Argon was introduced into the epitaxial reactor to replace air. Thereafter, the supply of argon was suspended, and high-purity hydrogen gas was introduced into the reactor at a flow rate of 2800 ml/min, and while doing so, the reactor was heated up.

After the temperature in the Ga-containing quartz boat setting region and the temperature in the substrate setting region reached 830° C. and 750° C., respectively, with these temperatues being maintained, hydrogen chloride gas was supplied to the reactor for 2 minutes at flow rate of 90 ml/min from the downstream side of the Ga-containing quartz boat to etch the surface of the GaAs single crystal substrate.

After the supply of the hydrogen chloride gas was suspended, hydrogen gas containing 10 ppm by volume of diethyl tellurium was supplied to the reactor at a flow rate of 10 ml/min.

Subsequently, hydrogen chloride gas was blown into the reactor at a flow rate of 20.2 ml/min so as to come into contact with the surface of gallium in the quartz boat. Subsequently, arsine ($AsH_3$) and phosphine ($PH_3$) were supplied to the reactor to form a varied-composition layer as a first layer in the manner described below.

Both $PH_3$ and $AsH_3$ gases were diluted with $H_2$ to a concentration of 10%. $AsH_3$ was first supplied to the reactor at a flow rate of 376 ml/min, and the flow rate was gradually reduced to 353 ml/min in 9 minutes. At the same time, $PH_3$ was supplied with the flow rate being increased from 0 ml/min to 22.4 ml/min, thereby forming a 1st-1st layer.

For the next 20 minutes, the flow rates of $AsH_3$ and $PH_3$ were fixed at 345 ml/min and 67.2 ml/min, respectively, to form a 1st-2nd layer.

For the next 9 minutes, the flow rate of $AsH_3$ was gradually changed from 345 ml/min to 329 ml/min. At the same time, the flow rate of $PH_3$ was gradually changed from 22.4 ml/min to 44.8 ml/min, thereby forming a 1st-3rd layer.

For the next 20 minutes, the flow rates of $AsH_3$ and $PH_3$ were fixed at 329 ml/min and 44.8 ml/min, respectively, to form a 1st-4th layer.

For the next 9 minutes, the flow rate of $AsH_3$ was gradually changed from 329 ml/min to 306 ml/min. At the same time, the flow rate of $PH_3$ was changed from 44.8 ml/min to 89.6 ml/min, thereby forming a 1st-5th layer.

In this way, a first layer comprising the 1st-1st layer, 1st-2nd layer, 1st-3rd layer, 1st-4th layer and 1st-5th layers was produced formed in the form of a varied-composition layer.

After 60 minutes had elapsed from the point of time when the formation of the varied-composition layer was started, a fixed-composition layer was formed for 60 minutes with the flow rates of arsine-containing hydrogen gas, phosphine-containing hydrogen gas and diethyl tellurium-containing hydrogen gas being maintained at 282 ml/min, 89.6 ml/min and 11.2 ml/min, respectively. Subsequently, the temperature of the reactor was lowered to complete the production of the epitaxial wafer.

Various physical properties of the obtained epitaxial multilayer film were measured and analyzed. The results are shown in Table 4 below.

TABLE 4

| | (data concerning Example 3) | | | |
|---|---|---|---|---|
| Epitaxial layers | Carrier density cm$^{-3}$ | Layer thickness $\mu$m | Composition x | Rate of change in composition $\mu$m$^{-1}$ |
| 1st layer | about 9 × 10$^{16}$ | 29.3 | | |
| 1st-1st | | 3.9 | — | 0.033 |
| 1st-2nd | | 8.7 | 0.130 | 0 |
| 1st-3rd | | 3.8 | — | 0.035 |
| 1st-4th | | 8.9 | 0.264 | 0 |
| 1st-5th | | 4.0 | — | 0.033 |
| 2nd layer | 9.0 × 10$^{16}$ | 30.4 | 0.394 | 0 |

Figure 5:
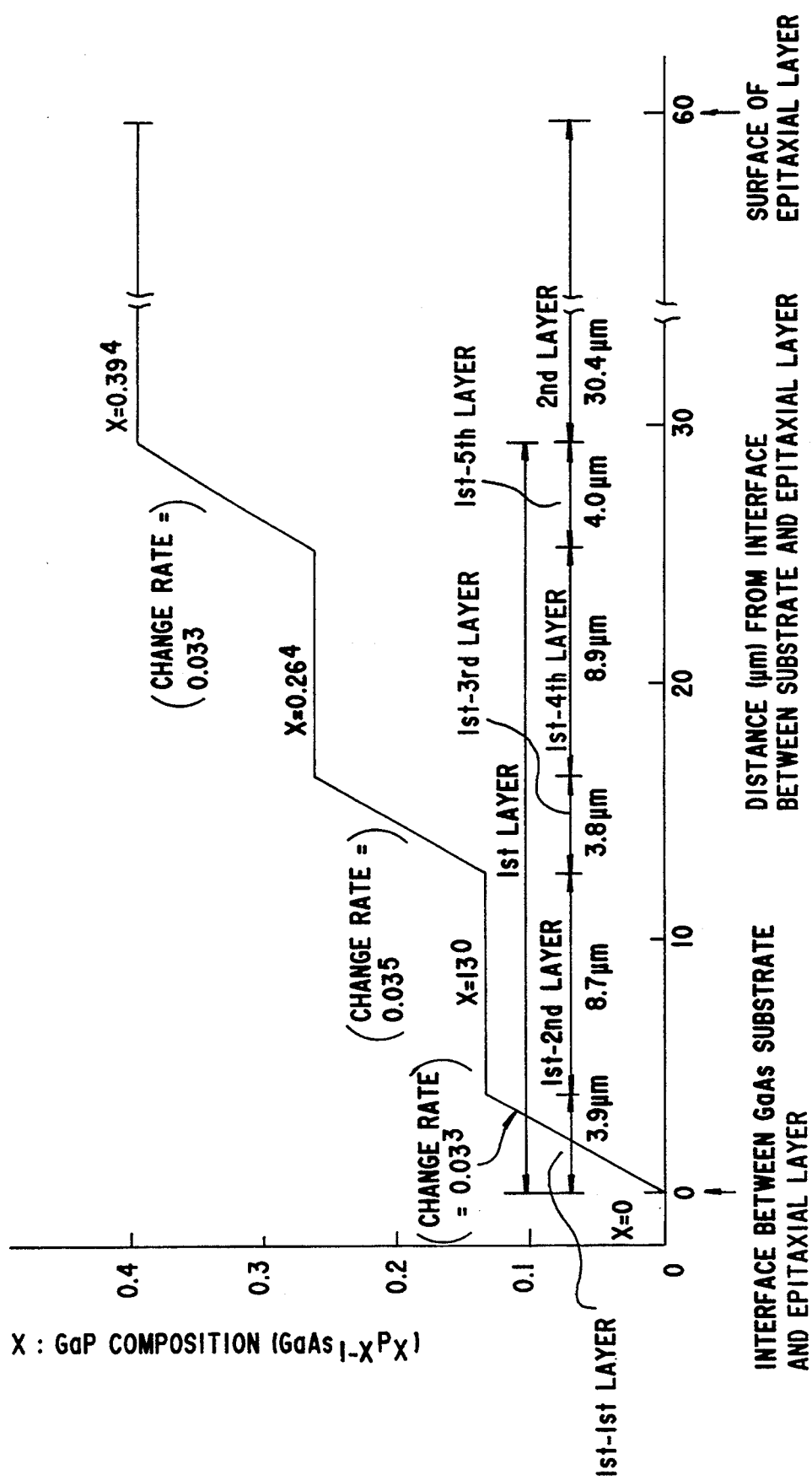
FIGS. 5 and 6 show sectional structures of examples of a light-emitting diode according to the present invention which employs a GaAs single crystal substrate.

FIG. 5 shows the sectional structure of the composition of this Example.

Next, a red light-emitting diode was prepared by employing the epitaxial wafer having the epitaxial film obtained by this Example, and the luminance (light output) of the diode was measured.

More specifically, the epitaxial wafer was vacuum-sealed in a high-purity quartz ampul, together with 25 mg of $ZnAs_2$ as a p-type impurity, to carry out thermal diffusion of impurities at a temperature of 720° C. The depth of the resulting pn junction was 3.8 $\mu$m from the surface.

The epitaxial wafer obtained as described above was subjected to a series of processes, i.e., a back side (substrate) polishing process, an electrode forming process, a wire bonding process, etc., on a device manufacturing line to prepare a red light-emitting diode chip.

Next, the light-emitting diode chip (both the chip size and the pn junction size were 500 $\mu$m by 500 $\mu$m square) was supplied with a direct current of 20 A/cm$^2$ in current density to measure the luminance (light output) under the condition that the chip had no epoxy resin coating. As a result, the peak wavelength was 660 nm±2 nm, and the luminance was from 1390 to 1520 Ft.L, on the average 1480 Ft.L.

[EXAMPLE 4]

An epitaxial wafer was prepared in the same way as in Example 3 except that the growth time for the 1st-5th layer was 20 minutes, and the physical properties were measured and analyzed by the same method as in Example 3. The results are shown in Table 5 below.

TABLE 5

(data concerning Example 4)

| Epitaxial layers | Carrier density $cm^{-3}$ | Layer thickness $\mu m$ | Composition x | Rate of change in composition $\mu m^{-1}$ |
|---|---|---|---|---|
| 1st layer | about 9 × $10^{17}$ | 29.3 | | |
| 1st-1st | | 3.8 | — | 0.035 |
| 1st-2nd | | 8.7 | 0.132 | 0 |
| 1st-3rd | | 3.9 | — | 0.033 |
| 1st-4th | | 8.9 | 0.262 | 0 |
| 1st-5th | | 8.9 | — | 0.015 |
| 2nd layer | 8.8 × $10^{16}$ | 30.9 | 0.393 | 0 |

Figure 6:
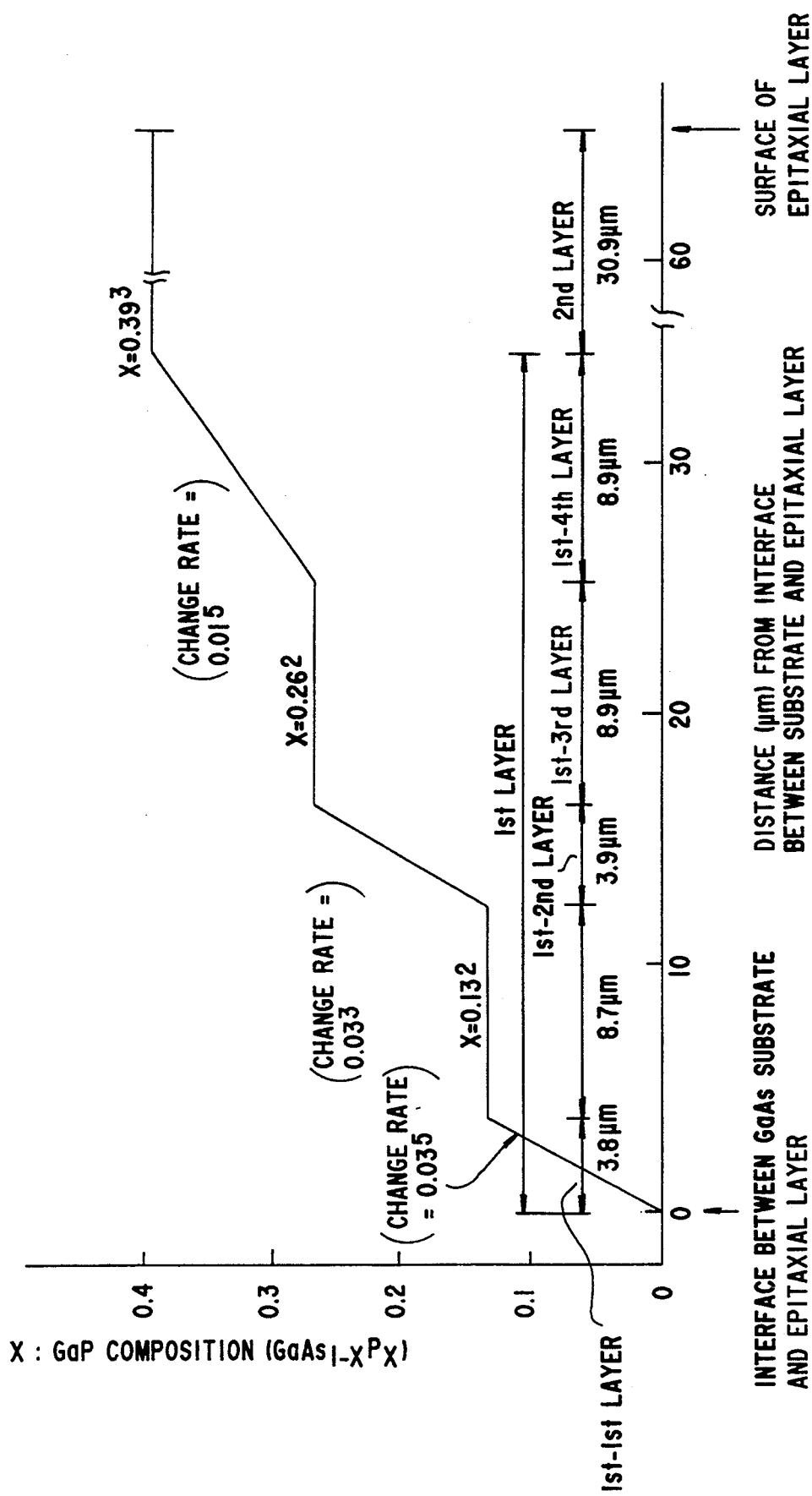

FIG. 6 shows the sectional structure of the composition of this Example.

Next, a diode chip was prepared in the same way as in Example 3, and the luminance of the chip was measured under the same conditions as in Example 3. As a result, the peak wavelength was 660 nm±2 nm, and the luminance was from 1410 to 1500 Ft.L, on the average 1460 Ft.L.

[Comparative Example 2]

A GaAs single crystal substrate which was in the form of a disk having a diameter of 50 mm and a thickness of 350 μm was employed as a single crystal substrate. The surface of the substrate, which had been mirror-polished, was 2.0° inclined toward $<\bar{1}10>$ direction from $(00\bar{1})$ plane. The GaAs single crystal substrate had silicon doped thereinto. The n-type carrier density in the substrate was $7.0 \times 10^{17}$ cm$^{-3}$.

The single crystal substrate was set in a horizontal quartz epitaxial reactor having an inner diameter of 70 mm and a length of 1000 mm. Subsequently, a quartz boat containing metal gallium was set in the reactor.

Argon was introduced into the epitaxial reactor to replace air. Thereafter, the supply of argon was suspended, and high-purity hydrogen gas was introduced into the reactor at a flow rate of 2800 ml/min, and while doing so, the reactor was heated up.

After the temperature in the Ga-containing quartz boat setting region and the temperature in the substrate setting region reached 830° C. and 750° C. respectively, with these temperatues being maintained, hydrogen chloride gas was supplied to the reactor for 2 minutes at flow rate of 90 ml/min from the downstream side of the Ga-containing quartz boat to etch the surface of the GaAs single crystal substrate.

After the supply of the hydrogen chloride gas was suspended, hydrogen gas containing 10 ppm by volume of diethyl tellurium was supplied to the reactor at a flow rate of 10 ml/min.

Subsequently, hydrogen chloride gas was blown into the reactor at a flow rate of 20.2 ml/min so as to come into contact with the surface of gallium in the quartz boat. Subsequently, arsine (AsH₃) and phosphine (PH₃) were supplied to the reactor to form a varied-composition layer as follows: Hydrogen gas containing 10% by volume of arsine was supplied to the reactor at a flow rate of 376 ml/min, and the flow rate was gradually reduced to 282 ml/min in 62 minutes. At the same time, hydrogen gas containing 10% by volume of phosphine was supplied at a flow rate of 0 ml/min, and the flow rate was gradually increased to 89.6 ml/min in 60 minutes.

After 60 minutes had elapsed from the point of time when the formation of the varied-composition layer was started, a fixed-composition layer was formed for 60 minutes with the flow rates of arsine-containing hydrogen gas, phosphine-containing hydrogen gas and diethyl tellurium-containing hydrogen gas being maintained at 282 ml/min, 89.6 ml/min and 11.2 ml/min, respectively. Subsequently, the temperature of the reactor was lowered to complete the production of the epitaxial wafer.

Various physical properties of the obtained epitaxial multilayer film were measured and analyzed. The results are shown in Table 6 below.

TABLE 6

(data concerning Comparative Example 2)

| Epitaxial layers | Carrier density $cm^{-3}$ | Layer thickness $\mu m$ | Composition x | Rate of change in composition $\mu m^{-1}$ |
|---|---|---|---|---|
| 1st layer | about 9 × $10^{16}$ | 27.0 | *④ 0.132 *⑤ 0.279 | <0.02 |
| 2nd layer | 9.2 × $10^{16}$ | 29.6 | 0.393 | 0 |

Figure 7:
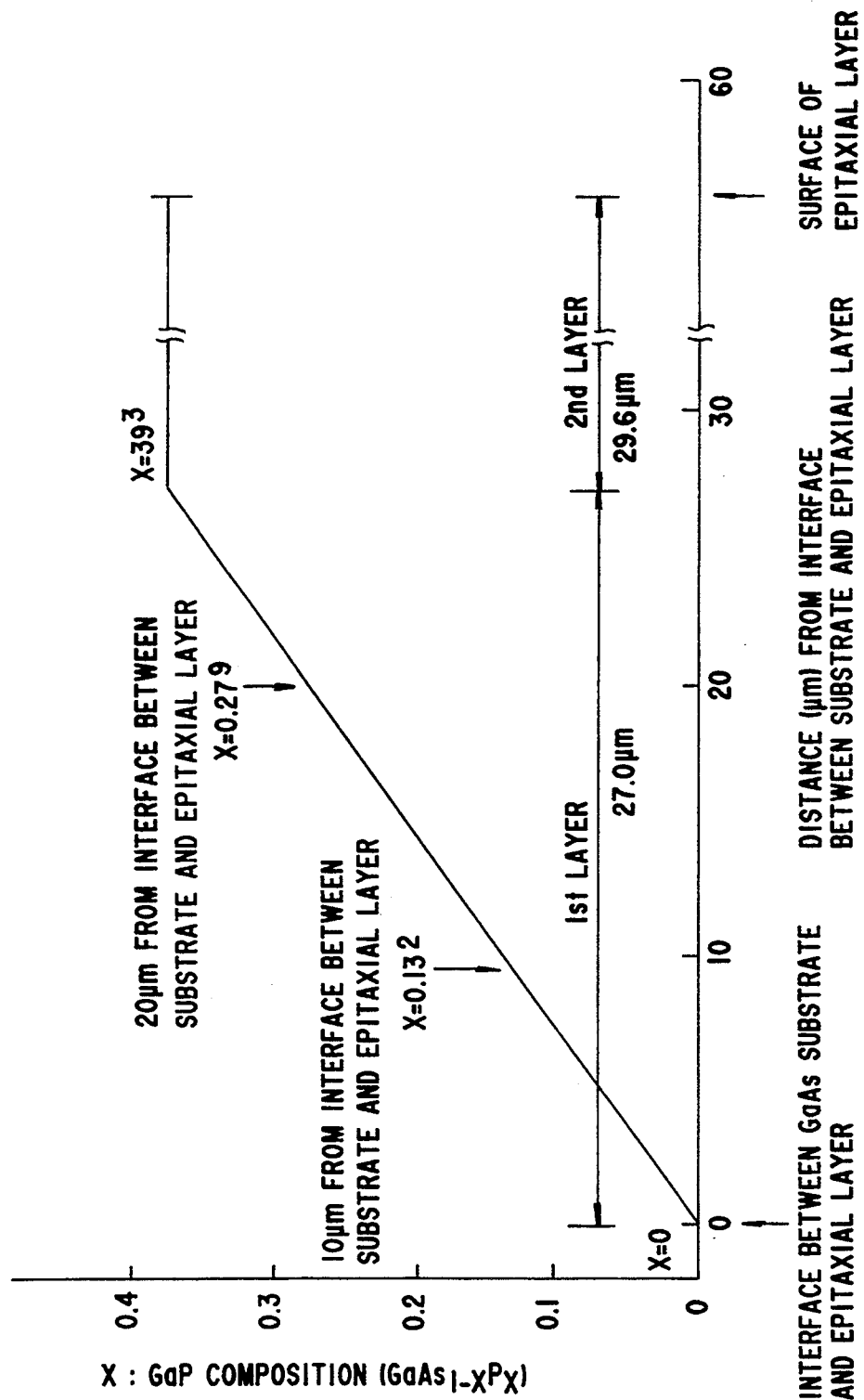
FIG. 7 shows a sectional structure of a comparative example.
Figure 8A:
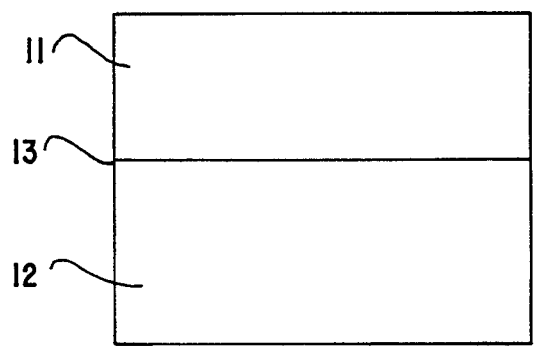
FIGS. 8 and 9 show sectional structures of conventional light-emitting diodes.
Figure 8B:
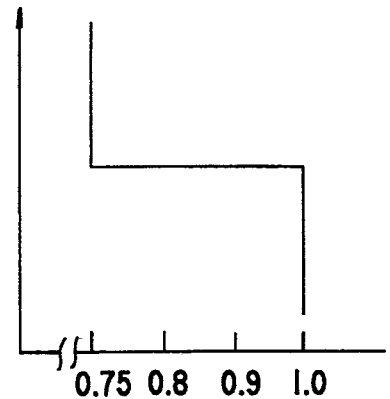
Figure 9A:
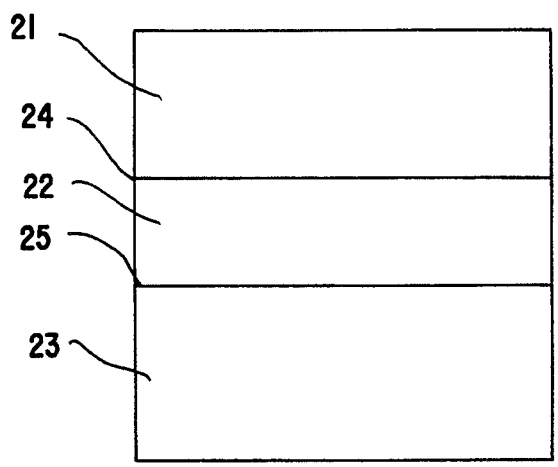
Figure 9B:
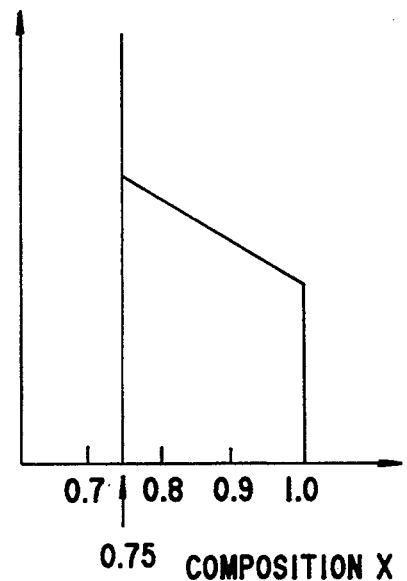

In Table 6, *④ and *⑤ represent values measured at respective positions which were 10 μm and 20 μm from the interface between the substrate and the epitaxial layer. As will be clear from Table 6, the rate of change in the composition in the varied-composition layer as the first layer was less than 0.02 (composition per μm). FIG. 7 shows the sectional structure of the composition of this Comparative Example.

Next, a red light-emitting diode was prepared by employing the epitaxial wafer having the epitaxial film obtained by Comparative Example 2, and the luminance (light output) of the diode was measured.

More specifically, the epitaxial wafer was vacuum-sealed in a high-purity quartz ampul, together with 25 mg of ZnAs₂ as a p-type impurity, to carry out thermal diffusion of impurities at a temperature of 720° C. The depth of the resulting pn junction was 3.9 μm from the surface.

The epitaxial wafer obtained as described above was subjected to a series of processes, i.e., a back side (substrate) polishing process, an electrode forming process, a wire bonding process, etc., on a device manufacturing line to prepare a red light-emitting diode chip. Next, the light-emitting diode chip (both the chip size and the pn junction size were 500 μm by 500 μm square) was supplied with a direct current of 20 A/cm² in current density to measure the luminance (light output) under the condition that the chip had no epoxy resin coating. As a result, the peak wavelength was 660 nm±2 nm, and the luminance was from 1050 Ft.L to 1160 Ft.L, on the average 1090 Ft.L.

Thus, according to the present invention, the varied-composition layer is comprised of a fixed-composition layer and a rapidly varied-composition layer, which alternate with each other, whereby the occurrence of dislocations due to lattice mismatch with a GaAs or Gap substrate can be suppressed in the varied-composition layer. Accordingly, a GaAs$_{1-x}$P$_x$ layer of excellent crystal quality and with minimal dislocations and other crystal defects can be obtained as a luminescent layer, and it is possible to obtain a high-luminance light-emitting diode by employing the epitaxial wafer according to the present invention.

What is claimed is:

1. An epitaxial wafer comprising:
    a GaAs or GaP single crystal substrate;
    a $GaAs_{1-x}P_x$ fixed-composition layer that is crystally grown over said GaAs or GaP single crystal substrate; and
    a varied-composition region that is formed between said substrate and said fixed-composition layer, said varied-composition region comprising at least two varied-composition layer portions and at least one fixed-composition layer portion with a thickness of 1 $\mu$m or more formed between said two varied-composition layer portions, at least one of said varied-composition layer portions being formed such that the rate of change in the composition $\Delta x$ per $\mu$m satisfies the following condition:

about $0.02 \leq \Delta x \leq$ about $0.08$

* * * * *